United States Patent
Mailley et al.

(10) Patent No.: US 8,071,161 B2
(45) Date of Patent: Dec. 6, 2011

(54) DLI-MOCVD PROCESS FOR MAKING ELECTRODES FOR ELECTROCHEMICAL REACTORS

(75) Inventors: Sophie Mailley, Le Pin (FR); Philippe Capron, Luzinay (FR); Stéphanie Thollon, Saint Nizier du Moucherotte (FR); Thierry Krebs, Le Versoud (FR)

(73) Assignee: Commissariat a l'Energie Atomique, Paris (FR)

( * ) Notice: Subject to any disclaimer, the term of this patent is extended or adjusted under 35 U.S.C. 154(b) by 399 days.

(21) Appl. No.: 12/179,817

(22) Filed: Jul. 25, 2008

(65) Prior Publication Data

US 2010/0215845 A1  Aug. 26, 2010

Related U.S. Application Data

(63) Continuation of application No. PCT/FR2007/050651, filed on Jan. 15, 2007.

(30) Foreign Application Priority Data

Feb. 3, 2006  (FR) ..................................... 06 50399

(51) Int. Cl.
*B05D 5/12* (2006.01)
(52) U.S. Cl. ........ 427/115; 427/122; 427/124; 427/125; 427/249.1; 427/250; 427/255.7; 427/569; 427/577
(58) Field of Classification Search .................. 427/115, 427/122, 124, 125, 249.1, 250, 255.7, 569, 427/577
See application file for complete search history.

(56) References Cited

U.S. PATENT DOCUMENTS

| | | | |
|---|---|---|---|
| 6,162,712 A | 12/2000 | Baum et al. | |
| 6,610,436 B1 | 8/2003 | Dearnaley et al. | |
| 6,673,127 B1 | 1/2004 | Allen et al. | |
| 6,991,871 B2 * | 1/2006 | Nagoshi et al. | 429/465 |
| 7,060,384 B2 * | 6/2006 | Yoshida et al. | 429/481 |
| 7,125,620 B2 * | 10/2006 | Acker et al. | 429/481 |
| 7,608,334 B2 * | 10/2009 | Frisk et al. | 428/421 |
| 2002/0006468 A1 * | 1/2002 | Paranjpe et al. | 427/96 |
| 2002/0049134 A1 | 4/2002 | Imazato | |
| 2004/0167014 A1 | 8/2004 | Yan et al. | |
| 2008/0241604 A1 * | 10/2008 | Moore et al. | 429/12 |
| 2008/0292933 A1 * | 11/2008 | Yu et al. | 429/30 |
| 2009/0029236 A1 * | 1/2009 | Mailley et al. | 429/44 |
| 2009/0075139 A1 * | 3/2009 | Kucernak et al. | 429/30 |
| 2010/0062305 A1 * | 3/2010 | Kadotani et al. | 429/30 |

FOREIGN PATENT DOCUMENTS

| | | | |
|---|---|---|---|
| EP | 0 872 906 A1 | | 10/1998 |
| EP | 0 928 036 A1 | | 7/1999 |
| JP | 2004-39384 | * | 2/2004 |
| WO | 03/015199 A1 | | 2/2003 |

OTHER PUBLICATIONS

Jordan, L.R., et al., "Diffusion layer parameters influencing optimal fuel cell performance". Journal of Power Sources 86 (2000) pp. 250-254.*
Pasaogullari, Ugur, et al., "Liquid Water Transport in Gas Diffusion Layer of Polymer Electrolyte Fuel Cells". Journal of the Electrochemical Society, 151 (3) A399-A406 (2004).*
Litster, S. et al., "PEM fuel cell electrodes". Journal of Power Sources 130 (2004) pp. 61-76.*
Giorgi, L., et al., "Influence of the PTFE content in the diffusion layer of low-Pt loading electrodes for polymer electrolyte fuel cells." Electrochimica Acta, vol. 43, No. 24, pp. 3675-3680, 1998.*
S. Thollon et al., "*Pulsed Liquid Injection Metalorganic Chemical Vapor Deposition of Metallic Nanostructured Catalysts. Evaluation of their deVOC Catalytic Properties*," Meeting Abstracts, Electrochemical Society, Pennington, NJ, 2005, p. 87.
S. Adora et al., "*Electrocristallization of Platinum Nanoparticles Supported on Carbon Analyzed with Standard and Anomalous X-ray Diffraction*," Journal of Crystal Growth, Elsevier, Amsterdam, NL, vol. 275, No. 1-2, Feb. 15, 2005, pp. e2207-e2210.
T. Goto, et al., "*Electrochemical Properties of Iridium-Carbon Nano Composite Films Prepared by MOCVD*," Scripta Materialia, Elsevier, Amsterdam, NL, vol. 44, No. 8-9, May 18, 2001, pp. 1187-1190.
P. Serp et al., "*Controlled-Growth of Platinum Nanoparticles on Carbon Nanotubes or Nanospheres B MOCVD in Fluidized Bed Reactor*," Journal de Physique IV, Editions De Physique, Les Ulis Cedex, France, vol. 12, No. 4, Jun. 2002, pp. PR4-PR29.
A.E. Aksoylu et al., "*Highly Dispersed Activated Carbon Supported Platinum Catalysts Prepared by OMCVD: a Comparison with Wet Impregnated Catalysts*", Applied Catalysts A: General, Elsevier Science, Amsterdam, NL, vol. 243, No. 2, Apr. 10, 2003, pp. 357-365.

* cited by examiner

*Primary Examiner* — Bret Chen
(74) *Attorney, Agent, or Firm* — Burr & Brown

(57) ABSTRACT

A method for fabricating an electrode for electrochemical reactor is provided, wherein the electrode includes a porous carbon diffusion layer and a catalyst layer. The method includes a step of depositing the catalyst layer on the diffusion layer by a DLI-MOCVD process.

12 Claims, 4 Drawing Sheets

DLI-MOCVD PROCESS FOR MAKING ELECTRODES FOR ELECTROCHEMICAL REACTORS

FIELD OF THE INVENTION

The invention relates to the field of electrochemical reactors such as fuel cells and storage batteries and more particularly the field of electrodes used in such cells. It relates more specifically to the deposition of catalyst particles constituting the active part of the electrodes of fuel cells, of the PEMFC (Proton Exchange Membrane Fuel Cell) type.

According to the invention, this deposition is carried out by the DLI-MOCVD (Direct Liquid Metal Organic Chemical Vapour Deposition) process, making it possible to immobilise the catalyst particles directly on the electron conductor support components (GDL for Gas Diffusion Layer), and thereby to optimise the use of the immobilised catalyst load and to favour the organisation of the catalyst layer for electrocatalysis.

This method, which serves to control the load of immobilised catalyst particles and the morphology of the particles, can be industrialised easily and developed for mass production of electrodes for fuel cells because it is compatible with continuous deposition processes.

The electrodes thereby obtained have a unique structure, the catalyst being in the form of nanoparticles directly dispersed on the diffusion layer.

Broadly speaking, the invention relates to any electrode material used for fuel cell and battery systems in power generation.

BACKGROUND OF THE INVENTION

The material constituting the electrodes of a fuel cell operating at low temperature (PEMFC, DMFC, alkaline solid membrane battery) is produced on a carbon support based on fabric, paper or felt, which plays the role of support for the diffusion layer and ensures the mechanical strength of the electrode.

The electron conducting properties of the electrode material and of the gas diffusion material derive from this support material and from the carbon inks or pastes introduced mechanically or sprayed on the surface of the support of the diffusion layer to form the charge percolation network.

FIG. 1 shows a schematic view of an assembly of an electrode of the type in question of the prior art. Microporous carbon 1 is generally sprayed on one of the faces of the diffusion layer to support the catalyst layer and to ensure good gas diffusion.

The catalyst layer is a fundamental element of the membrane-electrode assembly. Due to the presence of the catalyst particles 2 (platinum or other noble metals), the hydrogen oxidation and oxygen reduction reactions implemented in the fuel cells occur on either side of the proton conducting separating membrane 3 and thereby permit the generation of electrons.

The formulation of the catalyst layer with low loads of noble metals is one of the key factors in the development of PEMFC type fuel cell. In fact, several economic studies conducted in the early 2000 s have demonstrated that the platinum introduced in the catalyst layers and the forming thereof constituted the second most costly component in the cell. A knowledge of physicochemical and electrochemical transfers occurring in the electrode materials shows that the catalyst particle content in the cell can only be reduced by optimising the morphology of the catalyst zone.

The active layer forming methods most commonly reported in the literature are based on the principle of deposition, on the diffusion layer, of a spray of C/Pt particles placed in suspension in a light solvent, such as alcohol, and incorporating a polymer binder, the latter ensuring the mechanical strength and the water management. Over the last twenty years, a sharp decrease in platinum loads in the electrode material has been achieved.

This decrease was associated with the combination of platinum nanoparticles immobilised on carbon 5 and the use of a proton conducting impregnating film 4. Thus, the catalytic site becomes active as it integrates the proton conduction network and the electron charge percolation network directly in contact with the particle. This zone is active to the extent of the accessibility of the fuel or the oxidising gas, that is, it is limited by the material input.

In present embodiments, as illustrated in FIG. 1, the morphology of the active layer is unfortunately not optimal. In fact, only 50 to 75% of the platinum introduced into these active layers is recognised as electroactive. This loss of electroactivity is associated with the poor distribution of the catalyst. The various limitations have the following causes:

- non-optimal electron charge transfer, the carbon percolation network then not being continuous from the C/Pt particle to the diffusion layer and through the diffusion layer to the bipolar plates;
- or by limiting material transport, the catalyst particle no longer being reached by the gas (if for example the platinum is located opposite the carbon particle);
- or by a proton conduction network (obtained by impregnation with a proton conducting solution or by contact of the electrode with the membrane) preventing access to the catalyst particle.

Optimal formulations of active layers on diffusion layer support have been described. More particularly, the formulation of E-Tek electrodes, sold by DeNora, is reported in documents EP-A-0 872 906 and EP-A-0 928 036.

The literature reports the possibility of improving the performance of the cells by adjusting the methods of incorporation of the proton conductor. By optimising the Nafion content incorporated in the active layer, the kinetic operating range of the fuel cell (low current density range) can be improved. However, for very low platinum loads, this improvement occurs to the detriment of the high current density range, with a limitation by mass transfer being reached more rapidly and an increase in electrode-membrane interface resistance.

The active layers have been the subject of several modelings aimed to determine their optimal organisation, by increasing the geometric surface area of the platinum developed and by minimising the resistance effects associated with the proton conductor and the carbon. Based on these modelings, new structures have been tested, either introducing multilayer structures (alternating catalyst layer and proton conducting film), or fibres impregnated with proton conductor, or porophores. The most satisfactory results were obtained by the introduction of porophoric systems into the active layers, as described in document US 2001/0031389. The mass transfer is improved, thereby serving to meet the demand for operating applications of the cells in air.

In conjunction with the idea of a more open active layer to avoid limiting material transport and to reinforce the electron charge percolation network, the possibility has been developed of directly immobilising the catalyst particles on the diffusion layer support.

This type of operation is reported in the literature with various techniques: pulsed electrodeposition, microemulsion, spray coating, vacuum deposition (EBPVD in document U.S. Pat. No. 6,610,436, CCVD described in document WO 03/015199). However, these various techniques have non-negligible drawbacks.

Microemulsion processes are not suitable for obtaining a controlled particle distribution if directly deposited on the diffusion layer.

In the case of deposits by electrodeposition, the particle size obtained is generally higher than 50 nm and therefore has low electroactivity.

For deposits by PVD, the limitation to this type of process resides in the difficulty of obtaining nanodispersions of catalyst nanoparticles and of locating the catalysts close to the membrane, without losing some depth in order to respond to a higher catalytic activity during power draws.

The ion-beam processes, as described in document U.S. Pat. No. 6,673,127, do not allow a dispersion in depth, in more than 5 nm of the thickness of the diffusion layer.

The standard CVD deposition process has a particle growth yield that is too low for the deposition temperatures required by electrode supports (T<350° C.), or requires the use of alycyclic platinum precursors (see document U.S. Pat. No. 6,162,712) which are unfortunately very unstable at high temperature and in air.

It therefore clearly appears that the catalyst layers currently present in PEMFC type fuel cells, shown in FIG. 1, have the drawback of immobilising a high catalyst load which remains inaccessible to the proton conduction and gas diffusion network, or blocks the electron conduction.

An obvious need therefore exists to obtain novel catalyst layer structures not having all the above drawbacks and hence to identify a deposition technology suitable for producing such structures.

SUMMARY OF THE INVENTION

Thus, according to a first aspect, the invention relates to a method for fabricating electrodes of fuel cells.

Fuel cell electrodes are defined as the seat of electrochemical reactions (oxidation of the anode and reduction of the cathode), the said reactions only being possible in the presence of a catalyst. In practice, such electrodes comprise a support ensuring the mechanical strength, comprising at least one electron conducting microporous layer, also called diffusion layer, and covered with a catalyst layer and optionally in contact with a proton conducting film.

The method according to the invention is characterized in that the step of depositing the catalyst on the diffusion layer is carried out by DLI-MOCVD, and in that the said diffusion layer is made of porous carbon.

The implementation of the DLI-MOCVD process has certainly been reported in the journal Microelectronic Engineering (64 (2002) pp 457-463), but only for obtaining continuous platinum films for applications related to ferroelectricity.

On the other hand, and in the context of the invention, this technology generates catalyst nanoparticles in a nanometric dispersion and with a rapid growth rate, which prior deposition techniques did not serve to obtain. Accordingly, according to a second aspect, the invention also relates to electrodes for fuel cells having catalyst nanoparticles dispersed in direct contact with the diffusion layer.

In the context of the invention, the type of support on which these nanoparticles are formed is important for preventing the formation of a continuous film. More particularly, the microporosity of the surface layers of the gas diffusion electrodes must be taken into account for the final structure of the electrode material.

Thus, the porous carbon of the diffusion layer on which the deposition is carried out is made for example of carbon, graphite or nanotubes. The carbon may be of the Vulcan XC 72 or Shawanagan type.

To ensure good electrochemical operation, the proton conductor must also be brought into contact with the catalyst. In the prior art, to finalise the fabrication of the electrode material, the proton conductor is sprayed into an alcohol-containing solution thereby covering the catalyst particle distribution zones. According to the invention, the catalyst particles can be deposited on a microporous layer having a proton conductor. For example, platinum particles were deposited by DLI-MOCVD on a carbon layer having an equivalent Nafion® load of 0.4 mg/cm$^2$ via a Pt(COD) with a precursor diluted in a solvent (toluene) at a temperature of 210° C. This microporous layer can be deposited by spraying a solution of carbon particles mixed with a solubilised proton conductor. The film-forming proton conductor may or may not have the same structure as the separating membrane in the cell.

Conventionally, the catalyst is advantageously selected from the group of noble metals, preferably platinum (Pt). The catalyst particles deposited are preferably monometallic.

Furthermore, the immobilisation of platinum nanoparticles by the method of injecting organometallic liquid by CVD (DLI-MOCVD) can be carried out at high temperature, thereby providing a good bonding of the particles to the substrate. According to the invention, the deposition is therefore carried out at a temperature of preferably between 200 and 350° C.

In fact, for electrode materials, the problem arises of their aging and of the adhesion of the deposit. Studies have shown that the aging of the materials is reflected by a loss of catalyst by elution. The interface of the fuel cell electrodes being in contact with a water flow issuing either from the catalysis of the oxygen reduction, or the humidification of the gases, it is necessary to ensure the adhesion of the platinum particles. Since the production of active layers by spraying is carried out at fairly low temperatures (<200° C.), the adhesion of this type of structure is debatable despite the subsequent steps of hot pressing on the membrane. It is therefore justifiable to consider a method for producing particles at higher temperature on a structure having a good ex post facto cohesion without exceeding the limit temperature of the electrode support of about 350° C. The DLI-MOCVD technology is perfectly compatible with this temperature range.

The presence on the diffusion layer of a proton conductor, a material which has a well known sensitivity to temperature, implies that the method for immobilising the catalyst layer makes use of low temperature deposition, either by the use of specific low temperature precursors, or by the use of the plasma enhanced chemical vapour deposition (PECVD) process.

The principle of DLI-MOCVD is derived from conventional CVD systems. The reactive species are provided in liquid form and injected at high pressure by injectors. Thus, starting with a dilute precursor solution, the product consumption is reduced and can be controlled in volume or mass. This method therefore serves to control the morphology of the particles according to the preparation parameters (the mass of product injected, the injection frequency, the solvent of the precursor and the deposition time) and ensures a rapid and industrialisable production.

In practice, the catalyst nanoparticles are synthesised by DLI-MOCVD at atmospheric pressure or under vacuum (from 1000 Pa to 70 Pa in $N_2$—$O_2$ or $H_2$—$N_2$ mixture), with a deposition temperature of 500° C. or less, using a mixture of precursors such as organometallics (type β-diacetonates, carboxylates) soluble in a common solvent (acetyl acetone, THF, etc.), or using several independent sources of precursors, in the presence of a reaction gas mainly comprising an oxidising reactant gas (for example $O_2$, $CO_2$, etc.) or a reducing reactant gas ($H_2$).

To agree with the temperature behaviour properties of polymer compounds, low temperature precursors, such as organometallics, having COT or COD arene type groups (Pt-COD, $PtMe_2$ Cp, etc.), are used at the average deposition temperatures (<350° C.).

As already mentioned, the fabrication method according to the invention serves to tend towards an ideal structure, in which the catalyst particles 2 are directly fixed on the electron conductor support which plays the role of a gas diffusion layer 1 (FIG. 2). Thus, the catalysis zone effectively corresponds to the area called the "triple contact point", where the electron exchanges, the consumption of a gas reactant and the transfer of ionic species take place.

This method serves to obtain a very specific organisation of the catalyst layer. The electrode has dispersed catalyst particles in direct contact with the diffusion layer.

More precisely and as shown in FIG. 3, nanometer sized metal islands are observed (diameter lower than 50 nm, preferably between 1 and 20 nm), uniformly dispersed with an inter-particle distance of 2 to 30 nm at the surface of the microporous support formed by the diffusion layer.

The distribution of the catalyst particles is especially more advantageous when the proton conductor can be brought into contact with them. Thus and advantageously, the formulation of the microporous support for the deposition of the particles incorporates a certain content of proton conductor, preferably having the same composition as the one constituting the electrolyte membrane. To facilitate the seeding properties of the deposited particles, a plasma gas surface pre-treatment may be carried out.

The method of deposition by DLI-MOCVD serves to ensure good infiltration (above 5 μm of the particles deposited on micro- and nanoporous structures. Thus penetration depths of about 100 μm can be obtained using the method according to the invention, whereas the prior art methods only allowed for penetrations of a few microns, see for example the publication of Brault et al. in the Journal of Physics D: Applied Physics (37 (2004) pp 3419-23).

The penetration into the microporous support is distributed in a decreasing concentration gradient from the surface of the said layer, thereby meeting the various power draw conditions of the electrochemical reactor.

Due to the chemical nature of the deposited particles (noble metals or metal oxides) and the morphology of the deposits (a large number are very well dispersed nanometer sized active sites), the active layers used in the present invention appear to be highly efficient for the electrocatalysis of the reactions generated in fuel cells. This performance serves to obtain electrodes having catalyst loads, particularly of platinum, not exceeding 0.2 mg/$cm^2$.

The fuel cells and storage batteries comprising such electrodes are also part of the invention.

BRIEF DESCRIPTION OF THE DRAWINGS

The invention and the advantages thereof will appear more clearly from the exemplary embodiments that follow, provided for information and non-limiting, in conjunction with the appended figures.

DETAILED DESCRIPTION OF THE INVENTION

The examples presented below were prepared using a vapour deposition device sold by JIPELEC under the name "Inject, Système d' injection et d'évaporation de précurseurs liquides purs ou sous forme de solutions", coupled with a chemical vapour deposition chamber.

The JIPELEC device comprises several parts: the storage tank for the chemical solution, an injector (petrol, diesel) connected to the liquid tank by a feed line and controlled by an electronic control device, a carrier gas feed line, and a vaporisation device (evaporator).

The deposition chamber, which contains the substrate to be coated, comprises a heating system, a gas feed and pumping and pressure control means. The deposition chamber and the substrate are heated to a temperature above that of the evaporator, in order to create a positive thermal gradient.

The chemical solution is introduced into the pressurised tank (2 bar in the present case), and sent via the injector or injectors by pressure differential into the evaporator.

The injection flow rate is controlled for frequency and opening time by the injector.

This type of installation can easily be inserted in a continuous production line for electrode materials.

The method used is suitable for forming large electrode surfaces (>2 500 $cm^2$).

In the deposition conditions stated below, the platinum (Pt) nanoparticles are prepared on a commercial diffusion layer substrate of the ELAT type (product E-Tek, sold by De Nora).

The chemical deposition solution comprises the organometallic Pt precursor (acetylacetonate), dissolved in a solvent (acetylacetone).

The temperatures of the evaporator and the substrate are set respectively at 220° C. and 340° C.

The other operating conditions of the two examples are given in Table I below:

TABLE I

| | Operating condition supplied for tests 1 and 2. | | | | | |
|---|---|---|---|---|---|---|
| | Concentration mol/l | Injector frequency (Hz) | Injector opening time (ms) | $N_2/O_2$ flow rates (cc) | Pressure (Pa) | Deposition time (min) |
| Test 1 | 0.03 | 2 | 2 | 40/160 | 800 | 30 |
| Test 2 | 0.03 | 2 | 2 | 40/160 | 800 | 20 |

Figure 1:
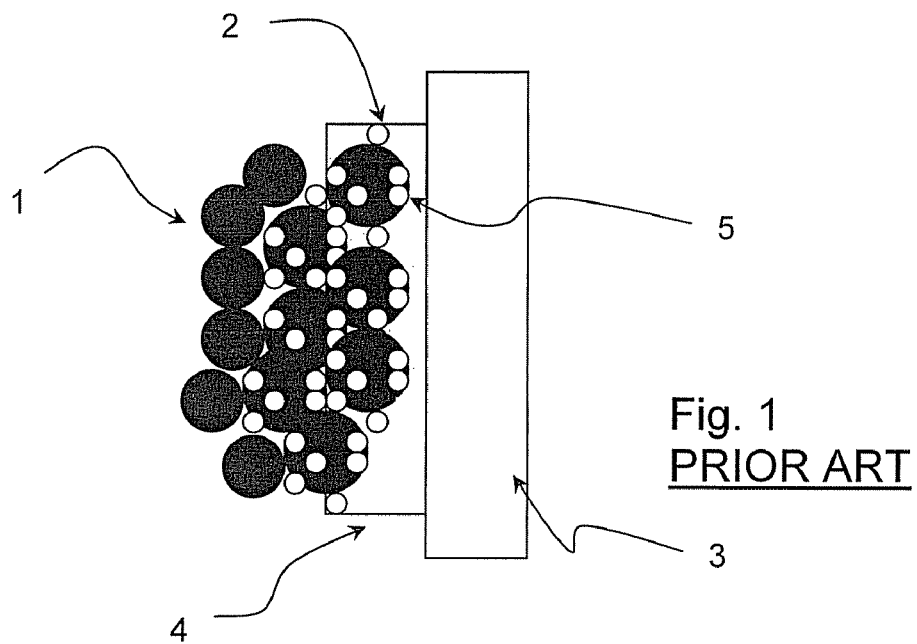
FIG. 1 is a schematic of the membrane/electrode assembly according to the prior art.
Figure 2:
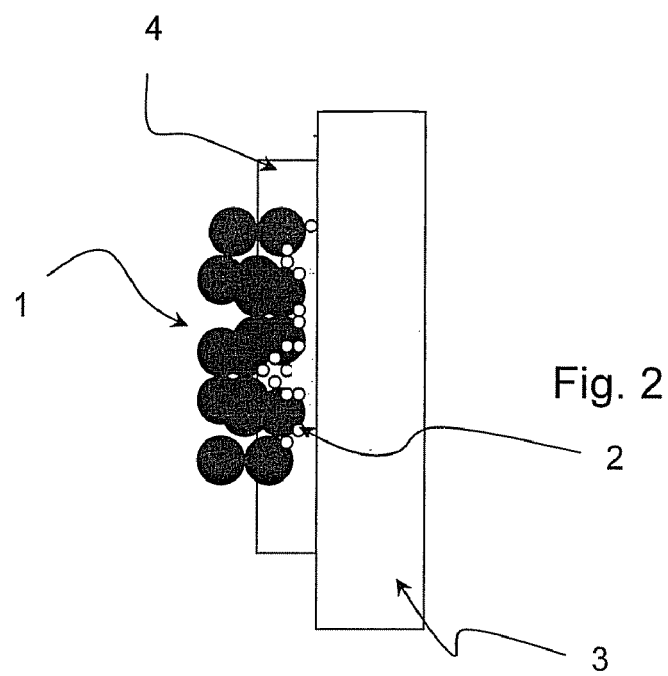
FIG. 2 is a schematic of a catalyst deposit according to the invention.
Figure 3:
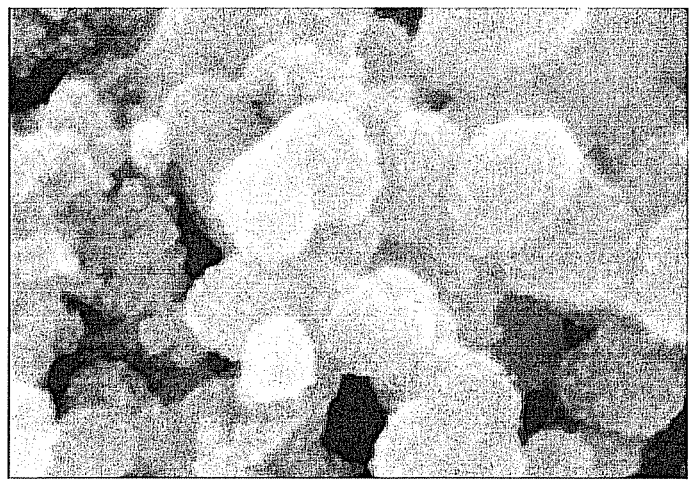
FIG. 3 is a micrograph of a catalyst deposit obtained according to the invention.
Figure 4:
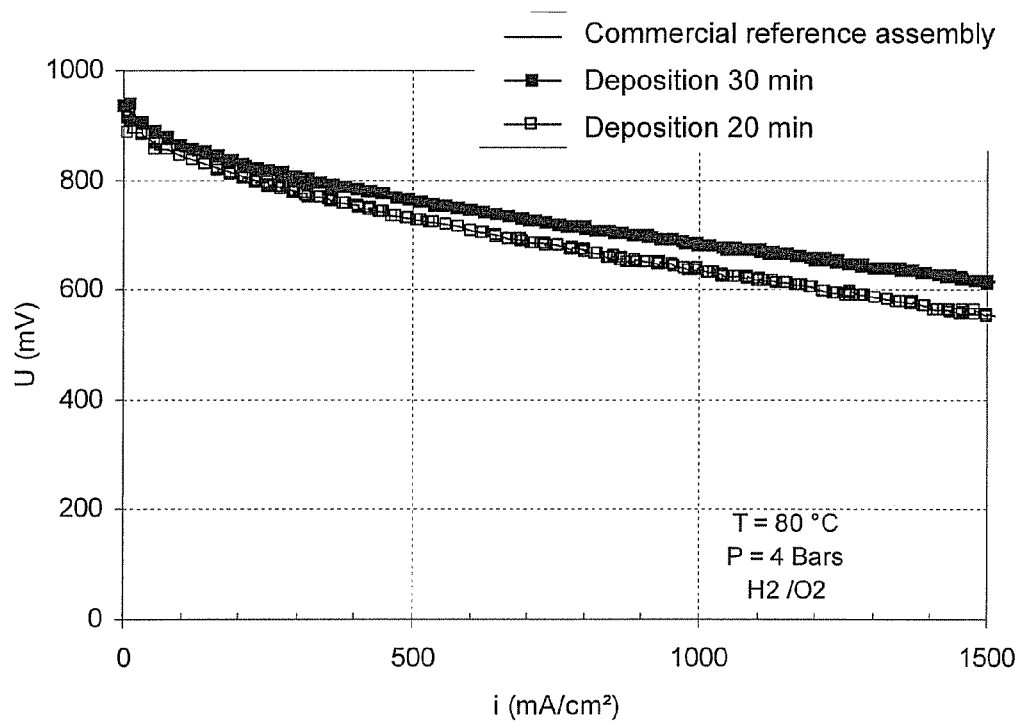
FIG. 4 shows bias curve obtained in the exemplary embodiment in $H_2$—$O_2$.
Figure 5:
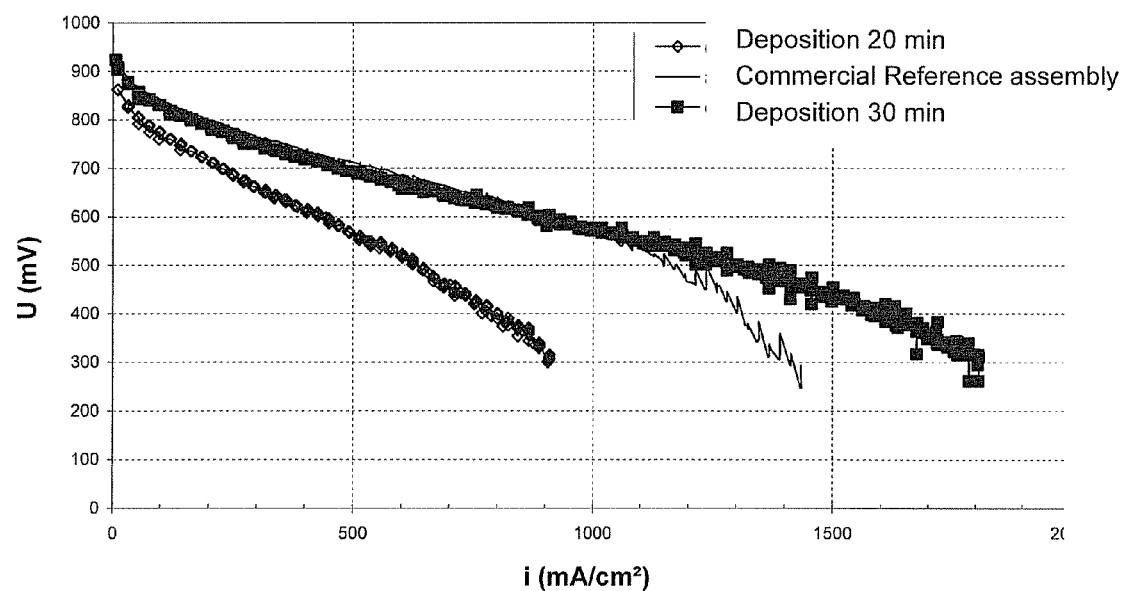
FIG. 5 shows bias curve obtained in the exemplary embodiment in $H_2$— air (T=80° C.; P=4 bar absolute).

The bias curves (FIGS. 4 and 5), obtained in a cell test with assembly, concern electrodes according to the invention. These curves reveal an improvement in mass transports at high current densities under air pressure (FIG. 5).

This behaviour is related to the more open structure of the electrode material having a thinner catalyst layer than the standard carbon-supported platinum deposits.

The electrode material according to the invention is suitable for operation in air.

Performance in pure oxygen (FIG. 4) is similar to that of the commercial products using carbon-supported platinum catalysts. However, it is important to note that the platinum loads are 0.17 mg/cm$^2$ for deposition of 30 minutes and 0.11 mg/cm$^2$ for deposition of 20 minutes respectively.

In comparison with the commercial materials prepared with carbon-supported platinum (platinum load=0.35 mg/cm$^2$), the electroactive surface liberated with an electrode according to the invention is therefore 40% larger.

Figure 6:
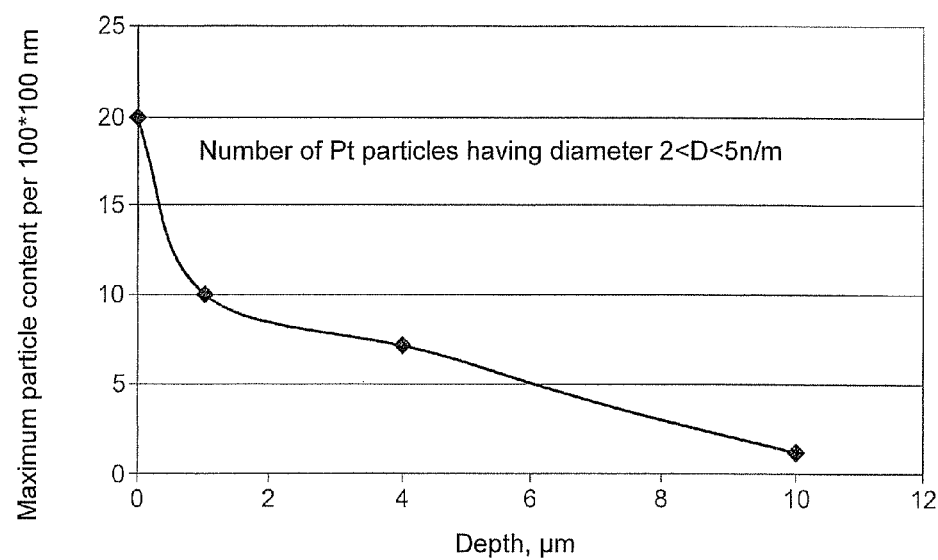
FIG. 6 shows platinum penetration profile in a porous carbon diffusion layer.
Figure 7:
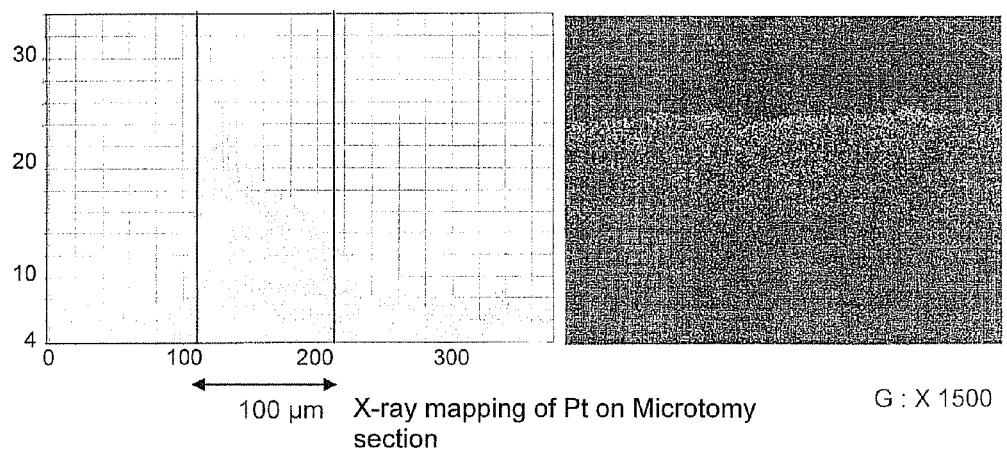
FIG. 7 shows platinum infiltration into microporous carbon, measured by X-ray analysis.

FIGS. 6 and 7 illustrate the platinum penetration profiles in a porous carbon diffusion layer.

More precisely, FIG. 7 shows an X-ray mapping of the platinum on microtomy section (magnification: ×1500). This is an electrode loaded with 0.15 mg/cm$^2$ of platinum. The deposition was carried out under the following conditions: 3.5 Hz; 30 minutes; Pt(COD) precursor=dimethyl 1–5 cyclooctadiene platinum (II) in xylene in a concentration of 0.025 mol/liter, with a substrate at 244° C. and under 1000 Pa. The infiltration of the catalyst into the microporous carbon is observed to reach a depth of about 100 microns. This considerable depth illustrates the advantage of the DLI-MOCVD technique compared to the other methods which only allow penetration of a few microns.

The method according to the invention and the electrodes described in the context of this invention therefore have substantial advantages. Among them, mention can be made of the following:

the fabrication of electrodes for PEMFC (Proton Exchange Membrane Fuel Cell) fuel cells with low catalyst load is suitable for reducing costs and for high electrocatalytic activity allowing improved performance;

the possibility of industrialising a continuous fabrication method;

the possibility of having a rapid and controllable growth rate in the context of such a device;

elimination of the post-sintering or pressing steps, necessary in the prior art methods;

improved mass transfer properties;

formulation of the catalyst layer support incorporating the electron charge percolation network (carbon network) and the proton transport network;

improved catalyst behaviour thanks to deposition at relatively high temperatures.

The invention claimed is:

1. A method for fabricating an electrode for electrochemical reactor, the electrode comprising a porous carbon diffusion layer and a catalyst layer which comprises a discontinuous layer of nanoparticles having a particle size that is smaller than a pore size of the porous carbon diffusion layer, comprising a step of depositing the catalyst layer on the diffusion layer by a DLI-MOCVD process at a temperature that does not exceed 350° C., wherein the nanoparticles diffuse to a depth corresponding to a triple contact point.

2. The method according to claim 1, wherein the catalyst layer is deposited at a temperature between 200° C. and 350° C.

3. The method according to claim 1, wherein the catalyst layer is deposited under atmospheric pressure or under vacuum.

4. The method according to claim 1, wherein the deposition of the catalyst layer by DLI-MOCVD is carried out using low temperature precursors.

5. The method according to claim 1, wherein the deposition of the catalyst layer by DLI-MOCVD is plasma enhanced.

6. The method according to claim 1, wherein the catalyst layer consists of platinum (Pt).

7. The method according to claim 1, wherein the diffusion layer made of porous carbon incorporates a proton conductor.

8. The method according to claim 1, wherein the porous carbon of the diffusion layer consists of carbon nanotubes.

9. The method according to claim 4, wherein the low temperature precursors are organometallic.

10. The method according to claim 1, wherein the diffusion depth of the nanoparticles is above 5 μm to 100 μm.

11. A fuel cell produced by a method comprising a step of fabricating an electrode according to the method of claim 1.

12. A storage battery produced by a method comprising a step of fabricating an electrode according to the method of claim 1.

* * * * *